United States Patent [19]

Kuze

[11] 4,435,827

[45] Mar. 6, 1984

[54] READ CLOCK PULSE CONTROLLER

[76] Inventor: Yoshikazu Kuze, 31-3, Higashimagome 1-chome, Ohta-ku, Tokyo, Japan, 143

[21] Appl. No.: 279,979

[22] PCT Filed: Oct. 30, 1979

[86] PCT No.: PCT/JP79/00277

§ 371 Date: Jun. 26, 1981

§ 102(e) Date: Jun. 26, 1981

[87] PCT Pub. No.: WO81/01339

PCT Pub. Date: May 14, 1981

[51] Int. Cl.³ .............................................. H03K 21/30
[52] U.S. Cl. ........................................ 377/44; 377/26; 364/900
[58] Field of Search ................ 377/20, 26, 39, 44, 377/52; 364/900, 200; 365/73, 189

[56] References Cited

U.S. PATENT DOCUMENTS

| | | | |
|---|---|---|---|
| 3,141,153 | 7/1964 | Klein | 365/73 |
| 3,683,159 | 8/1972 | Welch et al. | 377/26 |
| 4,155,037 | 5/1979 | Mazur | 364/900 |

OTHER PUBLICATIONS

"Single Counter Controlled Buffer", by Dunn et al., Published in IBM Technical Disclosure Bulletin, vol. 20, No. 5, Oct. 1977, pp. 1702-1703.

Primary Examiner—Gary Chin
Attorney, Agent, or Firm—John T. Roberts

[57] ABSTRACT

A clock pulse control device for address allocation of a read-only memory in a small size sequence controller in which data stored in the read-only memory are read out sequentially to operate an output relay during a time interval in accordance with the stored data, and the relay controls a load. Clock pulses generated by a frequency-dividing clock pulse generator (30) are applied to presetable down counters (33) and (34) in which the clock pulses are divided down to pulses each having a time period corresponding to the preset value. The divided pulses are applied to a binary counter (29). The outputs of the binary counter (29) are delivered to the read-only memory provided outside from address lines (Q1)–(Q7) via a connector (10) to allocated addresses of the read-only memory sequentially. Predetermined data are stored in the read-only memory in advance and the data of the allocated addresses are delivered to operate the output relay. The time period of the pulses to be applied to the binary counter (29) may be varied by changing-over a selecting switch (6) or changing the preset value of the presettable down counters (33) and (34).

2 Claims, 7 Drawing Figures

READ CLOCK PULSE CONTROLLER

TECHNICAL FIELD

The present invention relates to a read clock pulse controller for applying read clock pulses to a read-only sequence controller having an EPROM in an output relay unit.

BACKGROUND ART

A conventional sequence controller has a writing means and a reading means. However, the writing means is not used after a necessary data has been written in. Therefore the sequence controller having the writing means which is scarcely used is very unreasonable and expensive. In order to remove such disadvantages, it should be attempted to provide a sequence controller having a single function.

DISCLOSURE OF THE INVENTION

In accordance with the present invention, the sequence controller is divided into a write-only sequence controller and a read-only sequence controller. The write-only sequence controller is provided for writing data in an EPROM or MASK ROM to be attached thereto. The read-only sequence controller is adapted to mount the EPROM or ROM and to produce an output of the data in the EPROM or ROM.

Since data may be written in a plurality of EPROMs by one write-only sequence controller, an economical control system may be provided. Accordingly, only one write-only sequence controller can be used for writing data in EPROMs for a plurality of read-only sequence controllers, even if 1000 units of read-only sequence controller.

Further, the read-only sequence controller is divided into (A) an output relay control unit, and (B) a read clock pulse control unit.

The output relay control unit has an output relay unit to which the EPROM is attached. By applying read clock pulses to the output relay unit, the output is produced from the output relay unit.

A standard EPROM of the read-only sequence controller of the present invention is a type of N words×8 bits and the output relay comprises eight units.

Designating the read-only sequence controller as A and the read clock pulse controller as B, parallel 8-process outputs are obtained by A+B, 16-process outputs are obtained by 2A+B, 24-process by 3A+B, 32-process by 4A+B and 80-process by 10A+B. As will be seen, increase of the process may be achieved by just increasing the number of A.

The read-only sequence controller of the present invention may be made into a light device having a weight of 280 g and into a compact size. Thus, economical control may be provided for automatization of machine and for energy saving.

BEST MODE FOR EMBODYING THE INVENTION

Figure 1:
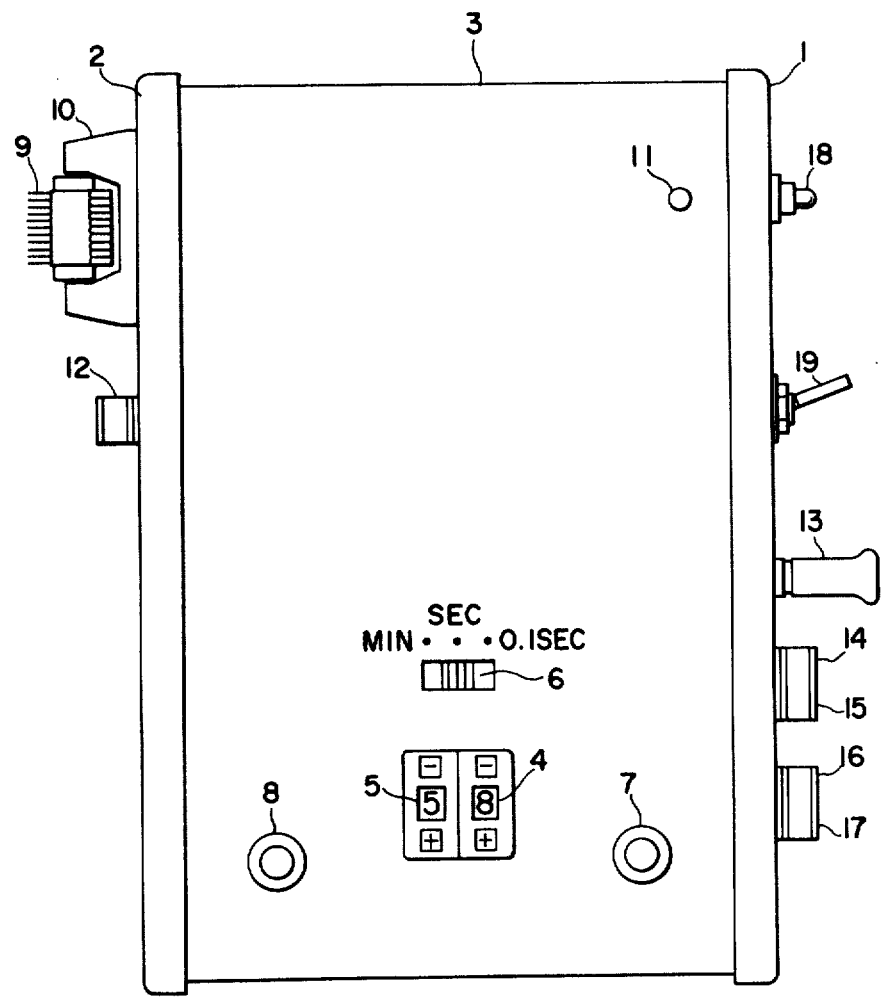
FIG. 1 shows a plan view of a read clock pulse controller according to the present invention.

Referring to FIG. 1, a case of the read clock pulse controller comprises panel plates 1 and 2 and a pair of covers 3 made of metal plate. Preset code switches 4 and 5 display 2 digits of two figures as the sequence cycle time. Numeral 6 is a cycle time select switch, 7 is a start switch, 8 is a stop switch. A ribbon cable 9 is connected to an outside output relay unit through a connector 10. Numeral 11 is a pilot lamp. A connector 12 is connected to a supply voltage DC. An abnormality detecting connector 13 is connected to an outer abnormality detecting circuit. An auto-start connector 14 is connected to an outside remote controller and an auto-stop connector 15 is connected to the outside remote controller. A connector 16 is connected to an outside remote control manual start switch. A connector 17 is connected to an outside remote control manual stop switch. Numeral 18 designates a reset switch. When a changeover switch 19 is turned OFF, one cycle of operation is done, while the switch 19 is turned ON, the cycle is repeated.

Figure 2:
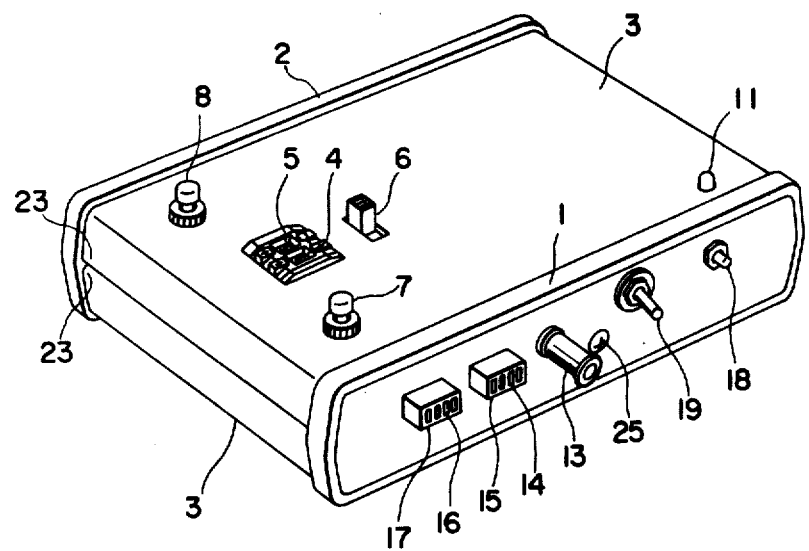
FIG. 2 shows a perspective view of the controller.
Figure 3:
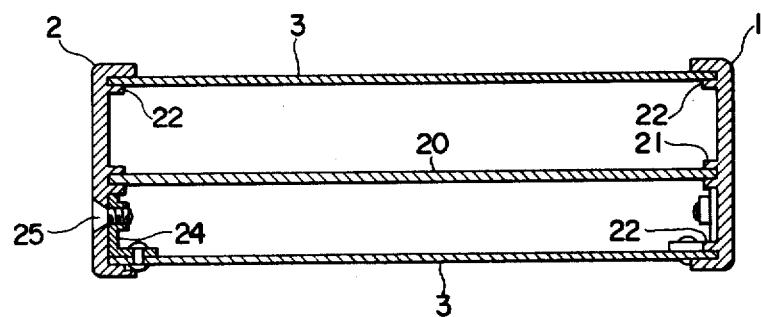
FIG. 3 shows a cross sectional view of the controller.

As shown in FIGS. 2 and 3, a pair of supporting projections 21 for a printed-wiring board 20 and projections 22 for covers 3 are formed in panels 1 and 2. Opposite end portions of each cover 3 are outwardly inclined and bent at ends 23 to reinforce the portions. Both covers 3 are abutted at bent ends 23 and supported between the projections 22 and secured by L-shaped members 24 and screws 25.

In order to generate the read clock pulses, a first preset code switches 4 and 5 and the select switch 6 are operated to select a necessary cycle time. If the select switch 6 is set to 0.1 SEC, digits "58" shown in FIG. 1 means that a cycle time of 5.8 seconds is provided. If the select switch is set to SEC, the cycle time is 58 seconds. Further, setting the select switch to MIN, makes the cycle time of 58 minutes. Each of the digits of the preset code switch can be changed from "0" to "9". Accordingly, 297 kinds of cycle time are available in total.

Figure 4:
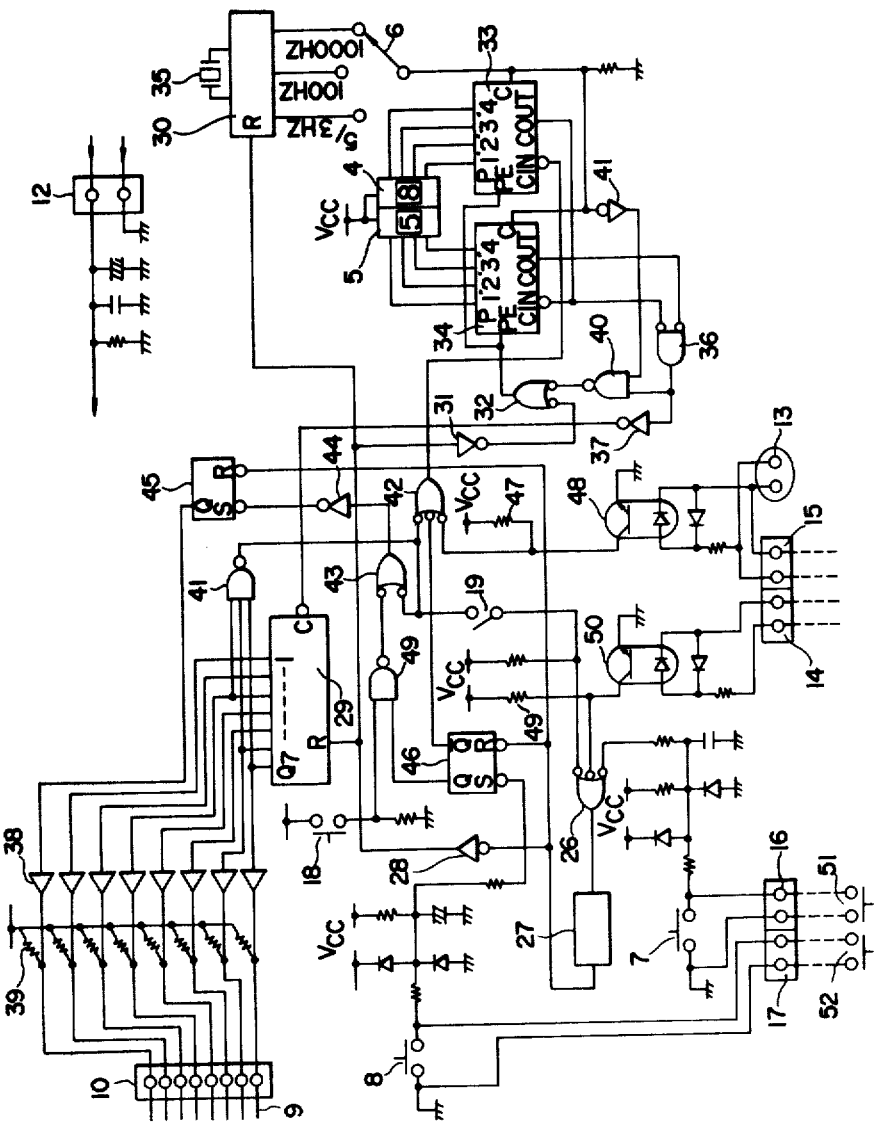
FIG. 4 shows a circuit of a read clock pulse controller.

Referring to FIG. 4, ribbon cable 9 is connected to the output relay unit. The cycle time is set, the changeover switch 19 is set to one-cycle side (OFF), and then the start switch 7 is depressed. A signal "0" is applied to a 3-input NAND gate 26 through a filter circuit and a gate protective circuit comprising resistors, a capacitor, and diodes. By the output "1" from the gate 26, a one-shot pulse "0" appears at the output of a one-shot pulse generating circuit 27. This signal is inverted through an inverter 28 to a one-shot pulse "1". This one-shot pulse "1" is applied (A) to a reset R of a binary counter 29 to reset it to the zero state, (B) to a reset R of a clock pulse generating circuit 30 comprising a frequency dividing circuit to reset it to the zero state, and (C) to inputs PE of presettable counters 33 and 34 through an inverter 31 and a 2-input NAND gate 32 to preset the digit "58" of preset code switches 4 and 5 in counters 33 and 34.

Outputs of crystal oscillator 35 is divided by the clock pulse generating circuit 30 into 1000 Hz, 100 Hz, and 5/3 Hz as clock pulses. Any one of these clock pulses is selected by the select switch 6.

The clock pulses are applied to clock lines C of the presettable counters 33 and 34 through the select switch 6. Preset lines P1, P2, P3 and P4 of the presettable counters are connected to BCD lines of preset code switches 4 and 5. Here it is assumed that each of presettable counters 33 and 34 is used as a down counter by connecting the UP/DOWN input thereof to the ground (not shown).

Each time one clock pulse is applied to the presettable counter 33, the count therein decreases by one. When the count goes to zero, the upper figure is changed from "5" to "4" and the lower figure is changed to "9". When 58 clock pulses are applied to the presettable counters, both inputs of a 2-input NOR gate 36 go to a "0". Thus, the 2-input NOR gate produces one read clock pulse which is applied to the clock line C of the binary counter 29 through an inverter 37. Accordingly, the binary counter 29 produces outputs through address lines Q1, Q2 . . . Q7. The outputs appear on the counter 10 after being amplified by buffers 38 and pulled up by resistors 39.

On the other hand, the output of the 2-input NOR gate 36 causes a 2-input NAND gate 40 to produce "0" when an inverter 41 produces output "1" by a negative going clock input. Thus, the presettable counter is preset through the 2-input NAND gate 32. At the same time, the "58" of preset code switches 4 and 5 are preset again in presettable counters 33 and 34.

Thereafter, every time 58 clock pulses are applied to presettable counters, one read clock pulse is generated. Time of one cycle is decided by the number of read clock pulse. Operation in the case of 100 clock pulses in one cycle will be explained hereinafter.

In order to produce the one-cycle end signal upon 100 read clock pulses, address lines Q3, Q6 and Q7 of the binary counter 29 are selected for the inputs of a 3-input NAND gate 41. Since the binary number of "100" is 1100100, when the 100 read clock pulses are applied to the input of the binary counter 29, outputs on the address lines Q3, Q6 and Q7 go to "1" and the 3-input NAND gate 41 produces a one-cycle end signal "0". By the one-cycle end signal.

(A) a "1" is applied through a 3-input NAND gate 42 to the CIN line of the presettable down counter 33 and stops counting, (B) a "0" is applied to a set input S of a first flip-flop 45 through a 2-input NAND gate 43 and an inverter 44, and the output Q "1" is applied through the buffer 38, the connector 10, and the ribbon cable 9 to the $\overline{CS}$/WE of the EPROM of the read-only sequence controller and the EPROM becomes to the non-selection state.

Therefore, the presettable counter stops counting and the EPROM stops producing the output, so that the machine to be controlled by this system stops after 5.8 seconds operation. By such operation, inspection of operation of the machine may be taken place. If the changeover switch 19 is set to ON side, a one cycle end signal "0" is applied to the 3-input NAND gate 26. This causes the same result as depressing the start switch. Thus, (A) the binary counter 29 is cleared, (B) the frequency dividing clock pulse generating circuit 30 is cleared, (C) a digit of the preset code switch is preset in the presettable down counter, (D) a "0" enters in the reset R of the first flip-flop 45 and the output Q "0" is applied to the $\overline{CS}$/WE of the EPROM of the read-only sequence controller and the EPROM becomes to the selection state.

Then, the presettable counter starts counting and read clock pulses are applied to the binary counter, so that address cells of the EPROM corresponding to address lines Q1, Q2 . . . Q7 are addressed to produce programing data. Thus, the machine operation is repeatedly continued at the cycle time of 5.8 seconds.

In order to stop the operation, the switch 19 is turned off, so that the operation stops at the end of one cycle. Depressing the stop switch 8, a "0" is applied to the set input S of a second flip-flop 46. A "0" of the output $\overline{Q}$ is applied to the 3-input NAND gate 42 to produce an output "1" which causes the stop of counting of the presettable counters.

Describing an abnormality detecting circuit, a collector of a photo transistor of a photo coupler 48, which is pulled up by a resistor 47, is connected to the ground through an emitter, and a light emitting diode is connected to a connector 13 to which an outer abnormality detecting circuit is connected. When the detecting circuit detects any abnormality, the photo coupler 48 turns on. Accordingly, a "0" is applied to the 3-input NAND gate 42, so that the presettable down counter stops counting and the machine stops.

In the case that the system of the present invention is used for controlling manufacturing machines, an unfinished work may be easily removed from the machine in the stop condition and inspection and repair of the system may be done.

If the start switch 7 is depressed after inspection and repair, the hold condition by first and second flip-flop is released and operation is restarted. The connector 15 connected to the connector 13 is to be connected to an outside controller for stopping the system. When the outside controller applies a signal to the system, the photo coupler 48 is turned on to stop the operation of the system.

A collector of a photo transistor of a photo coupler 50, which is pulled up by a resistor 49, is connected to the ground through the emitter, and the light emitting diode is connected to the connector 14 by means of the diodes of their respective polarities as shown and a resistor. When an outside controller emanates a signal, the photo coupler 50 is turned ON and a signal "0" is applied to the 3-input NAND gate 26. This causes the same result as depressing the start switch 7. Thus, the controller starts the operation at the cycle time of 5.8 seconds. That is the connector 14 is connected to a remote control start circuit and the connector 15 is connected to a remote control stop circuit.

Describing about a manual remote control circuit, the connector 16 is connected to both sides of the start switch 7 and to an outside start switch 51. The connector 17 is connected to both sides of the stop switch 8 and to an outside stop switch 52. System supply voltage is obtained by an outside supply voltage through the connector 12.

Figure 5:
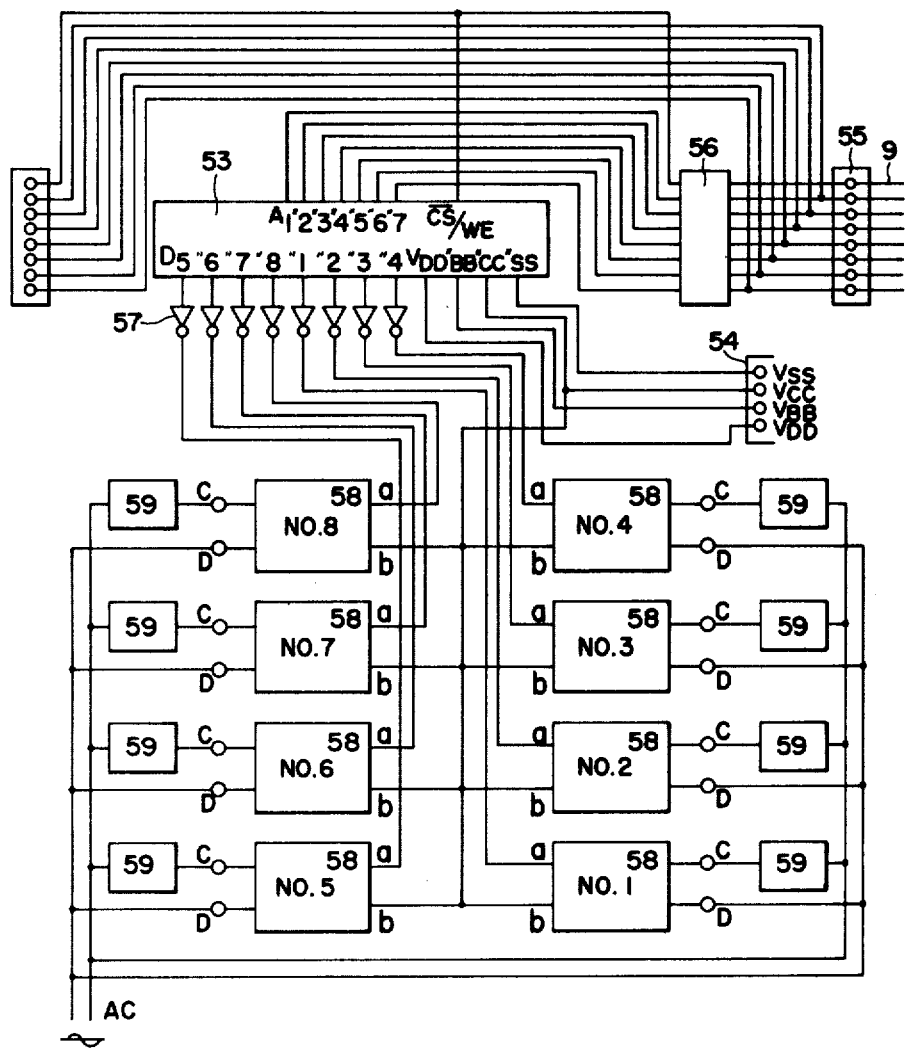
FIG. 5 shows a circuit of contact relay system connected to the read clock pulse controller of the present invention.

Referring to FIG. 5 showing a contactless relay system, a supply voltage DC from an external power source is applied to $V_{DD}$, $V_{BB}$, $V_{CC}$, and $V_{SS}$ of an EPROM 53 through a connector 54. When the start switch 7 of the read clock pulse controller is depressed, an input signal "0" is applied to $\overline{CS}$/WE of the EPROM, so that the EPROM is changed to selection state. Then, address pulses in synchronism with read clock pulses are applied to address lines A1, A2 . . . A7 in the EPROM 53 through the ribbon cable 9, connector 55 and a buffer 56, so that data in the EPROM 53 are produced from data outputs D1, D2 . . . D8 in parallel. Since driving circuits for eight output relays are the same construction, explanation about the driving circuit for the No. 1 output relay will be made hereinafter.

The signal "1" appeared on the output D1 in the EPROM 53 is inverted to "0" by an inverter 57. The current flows from $V_{CC}$ between inputs b and a so that the contactless relay 58 is turned on to drive a load 59. When the output of the output D1 goes to "0", the contactless relay 58 turns off so that driving of the load stops.

Figure 6:
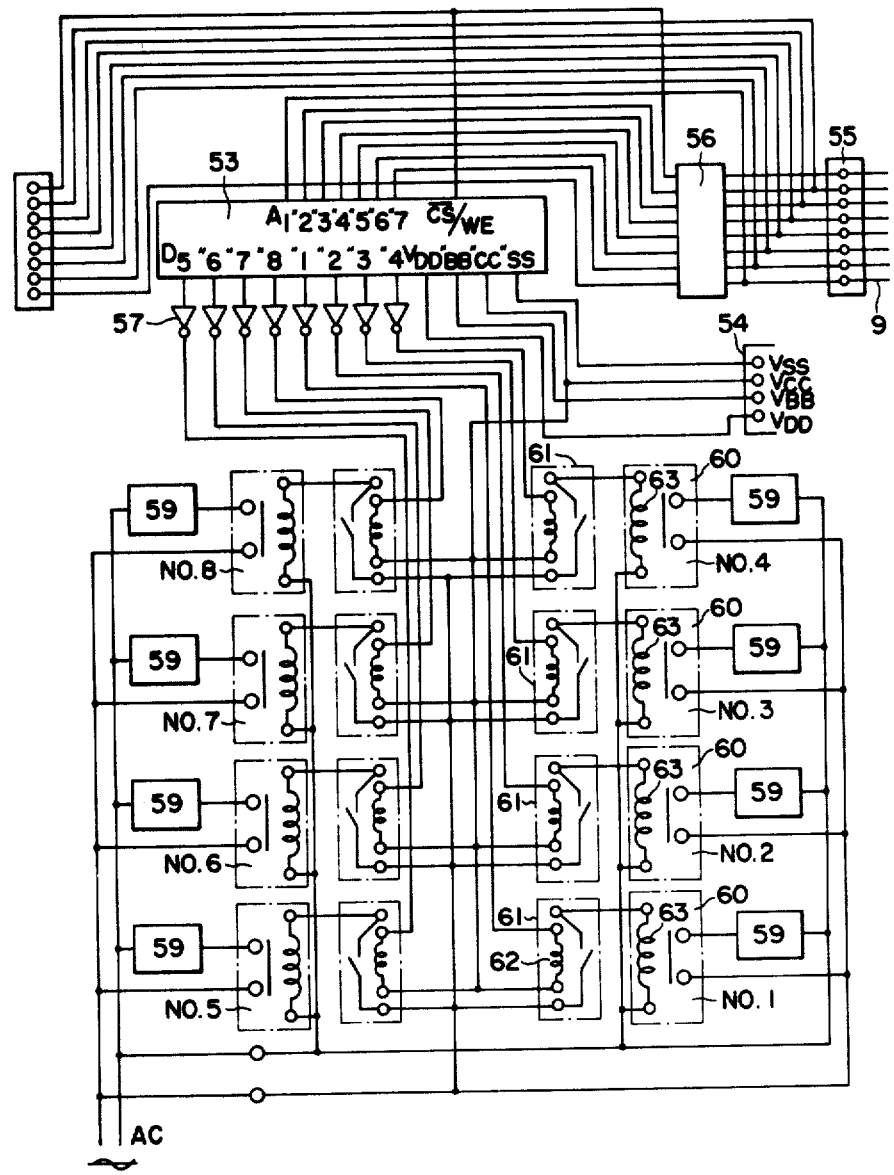
FIG. 6 shows a circuit of contactless relay system.
Figure 7:
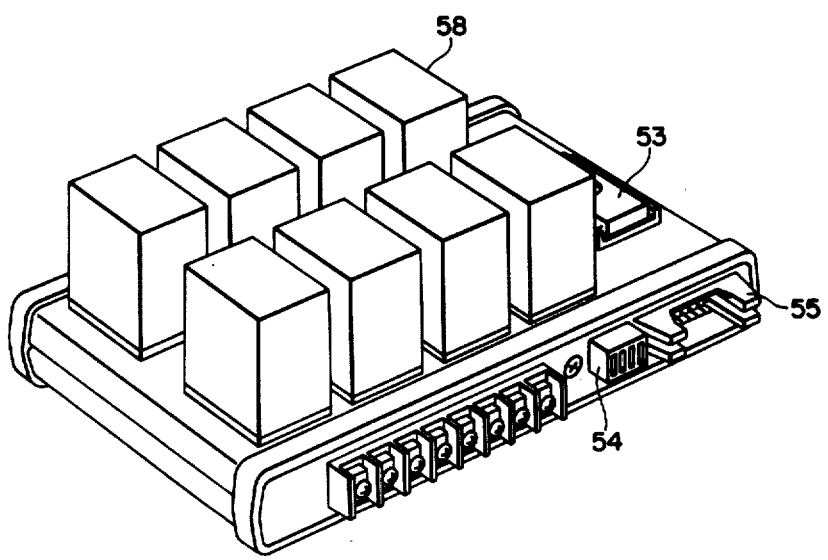
FIG. 7 shows a perspective view of a read-only sequence controller connected to the read clock pulse controller of the present invention.

Referring to FIG. 6 showing a contact relay system, a supply voltage DC from an external power source is applied to $V_{DD}$, $V_{BB}$, $V_{CC}$, and $V_{SS}$ of the EPROM 53 through a connector 54. When the start switch 7 of the read clock pulse controller is depressed, an input signal "0" is applied to $\overline{CS}$/WE of the EPROM, so that the EPROM is changed to selection state. Then, address pulses in synchronism with read clock pulses are applied to address lines A1, A2 . . . A7 in the EPROM 53 through the ribbon cable 9, connector 55 and a buffer 56, so that data in the EPROM 53 are produced from data outputs D1, D2 . . . D8 in parallel. The output data are applied to coils 62 of reed relays 61 through inverters 57 to control corresponding output relays 60.

Since driving circuits for eight output relays are the same construction, explanation about the driving circuit for the No. 1 output relay will be made hereinafter. The signal "1" appeared on the output D1 in the EPROM 53 is inverted to "0" by the inverter 57. The current flows from $V_{CC}$ through the coil 62 of the reed relay 61 so that the reed relay 61 is excited to turn on contacts thereof. Thus, current flows from the terminal AC to the coil 63 of the output relay 60 to turn on the relay 60 to drive load 59 connected to the output relay 60. When the output of the output D1 goes to "0", the reed relay 61 turns off. Thus, the output relay 60 turns off so that driving of the load stops.

In the circuit of FIG. 6, although a reed switch circuit is used as an isolation circuit between DC and AC, another isolation circuit, such as a photo-coupler circuit, photo-thyristor circuit or Cds circuit, may be employed.

PROBABILITY OF INDUSTRIAL EXPLITATION

The read clock pulse controller of the present invention has a light weight of 280 g. Therefore, the system is economical. The controller of the present invention can drive ten or more read-only sequence controllers, each of which has 8K bits (or 16K bits) memories. Thus, it is possible to automatize any kinds of machine, apparatus or system in a wide field and to save the energy.

I claim:

1. A read clock pulse controller for a read only sequence controller for a read-only memory comprising: a read clock pulse generating circuit (30); a select switch (6) for selecting the frequency of the read clock pulse; a presettable counter (33, 34) for counting the read clock pulse; a preset code switch (4, 5) for selecting the number of the read clock pulses counted by said presettable counter; a binary counter (29) connected to the output of said presettable counter; said presettable counter increments said binary counter by one whenever the presetted number of read clock pulses have been counted and the output of said binary counter is connected to the address lines of said read-only memory; a start switch (7) to initiate counting by applying a signal to a gate circuit (26); said gate circuit generating a signal to reset said binary counter to the zero state, to reset said clock pulse generating circuit to the zero state, and to preset the value in said presettable counter; a circuit means connected to an outer abnormality detecting circuit for generating a signal for inhibiting the counting operation of said presettable counter when an abnormality is detected by said outer abnormality detecting circuit.

2. The read clock pulse controller of claim 1 wherein an end signal is generated by binary counter (29) after a selected number of pulses, said end signal is applied to the presettable counter (33,34) to stop counting.

* * * * *